(12) United States Patent  
Sano

(10) Patent No.: US 7,280,025 B2  
(45) Date of Patent: Oct. 9, 2007

(54) MAGNETIC ELEMENT

(75) Inventor: Kan Sano, Minamimizumoto Katsushika-ku (JP)

(73) Assignee: Sumida Corporation (JP)

( * ) Notice: Subject to any disclaimer, the term of this patent is extended or adjusted under 35 U.S.C. 154(b) by 15 days.

(21) Appl. No.: 11/255,446

(22) Filed: Oct. 21, 2005

(65) Prior Publication Data

US 2006/0089022 A1 Apr. 27, 2006

(30) Foreign Application Priority Data

Oct. 22, 2004 (JP) ............................. 2004-307693

(51) Int. Cl.
*H01F 5/00* (2006.01)
(52) U.S. Cl. ..................... 336/200; 336/223; 336/232
(58) Field of Classification Search ................. 336/83, 336/200, 223, 232, 174, 17
See application file for complete search history.

(56) References Cited

U.S. PATENT DOCUMENTS

| | | | |
|---|---|---|---|
| 6,356,179 B1* | 3/2002 | Yamada | 336/175 |
| 6,359,541 B1* | 3/2002 | Watanabe | 335/301 |
| 6,525,635 B2* | 2/2003 | Murata et al. | 336/83 |
| 7,023,317 B1* | 4/2006 | Herbert | 336/205 |
| 2003/0201862 A1* | 10/2003 | Amtz et al. | 336/174 |
| 2004/0113736 A1* | 6/2004 | Schimel | 336/174 |
| 2005/0012582 A1* | 1/2005 | Sutardja | 336/175 |

FOREIGN PATENT DOCUMENTS

| | | |
|---|---|---|
| JP | 2599427 | 5/1995 |
| JP | 3366916 | 2/2001 |

* cited by examiner

*Primary Examiner*—Anh Mai
(74) *Attorney, Agent, or Firm*—Stephen Chin; Von Simson & Chin, LLP

(57) ABSTRACT

The magnetic element includes a core (20) provided with a through hole (21) passing through a tubular portion, a linear conductor (30) having a plated surface, which is to be inserted through the through hole (21), and a mounting terminal with its one end side is electrically connected to the conductor and another end side positioning on a bottom surface (22a) of the core (20), the mounting terminal being mounted to an external mounting substrate facing the bottom surface (22a). Further, the conductor (30) is provided integrally with the mounting terminal composed of a downward extension (31) extending from the one end side of the conductor (30) to the bottom surface (22a) side and formed by bending itself and a mounting portion (32) positioning on the bottom surface (22a) and formed by bending itself. Furthermore, a certain number of bottom surface recessed portion(s) (23) is/are provided in the bottom surface (22a) to fit the mounting portion(s) (32) of the mounting terminal(s) therein corresponding to the number of the mounting terminal(s), in which the depth of the bottom surface recessed portion (23) is designed to be smaller than the thickness of the mounting portion (32).

4 Claims, 11 Drawing Sheets

MAGNETIC ELEMENT

CROSS REFERENCE TO RELATED APPLICATIONS

This application claims priority of Japanese Patent Application Number JP2004-307693, filed on Oct. 22, 2004, the complete disclosure of which is hereby incorporated by reference.

FIELD OF THE INVENTION

The present invention relates to a magnetic element used for various electric products such as a power supply section of a computer.

DESCRIPTION OF THE RELATED ART

For instance, in a power supply section or the like of a computer, a switching element that operates at a high frequency (driven at a high frequency) is used in a switching circuit. When the operating frequency is high in the switching circuit as described above, a magnetic element used in the circuit is required to have a slight inductance value. As one kind of the magnetic element having such a slight inductance value, there is one disclosed in Japanese Patent Number 3366916 (refer to FIG. 2, paragraph No. 0011 and so on) (Patent document 1).

In the magnetic element disclosed in Patent document 1, a hollow portion passing longitudinally through a core of an almost rectangle shape is provided, and only a single band-shaped electric conductor (conductor) is provided inside the hollow portion along the longitudinal direction thereof. Further, the end portion of the conductor protrudes from the hollow portion and bent toward the bottom face side of the core.

By adopting such a configuration, the magnetic element with a small outside dimension and in the state of having a slight inductance value can be realized, the magnetic element further exhibiting a favorable direct current superposition characteristic and allowing a large current flow as well.

Meanwhile, in the magnetic element disclosed in the Patent document 1 described above, a surface-mount terminal, which is formed by the conductor bent after passing through the hollow portion, is mounted onto a substrate or so forth. In that case, the width of the hollow portion is substantially the same as of the conductor and when only a single conductor is inserted through the hollow portion, no positional displacement of the conductor is caused in the width direction of the hollow portion, arising no specific problem. However, for example, when two conductors are inserted through the hollow portion, a positional displacement between these two terminals causes a short or so forth, being undesirable. Further, even if it is a single conductor, when the conductor has a space between an internal wall surface of the hollow portion and itself, a positional displacement of the terminal may lead to a slight vibration, being a problem.

Further, the positional displacement caused in the hollow portion of the conductor frequently affects the characteristics of the magnetic element. Consequently, another problem with the respectively produced magnetic elements have different properties will arise as well.

SUMMARY OF THE INVENTION

The present invention has been made on the basis of the above-described circumstances, and an object thereof is to provide a magnetic element capable of positioning a conductor and reducing an outside dimension thereof.

In order to bring a solution to the above-mentioned problems, the magnetic element according to the present invention is a magnetic element comprising: a core formed by sintering a ferrite material to have a tubular shape and including a tubular portion and a through hole passing through the tubular portion; a conductor having a linear shape, electrical conductivity and a plating performed onto a surface thereof, the conductor being to be inserted through the through hole; and a mounting terminal with one end side of the mounting terminal being electrically connected to the conductor and another side of the mounting terminal positioning at a bottom surface of the core, the mounting terminal being to be mounted on an external mounting substrate facing the bottom surface, in which the conductor is formed integrally with the mounting terminal and the mounting terminal includes a downward extension extending from the one end side of the conductor to the bottom surface side of the core formed by bending and a mounting portion positioning on the bottom surface of the core formed by bending, and in which a number of piece(s) of bottom surface recessed portion(s) corresponding to a number of piece(s) of the mounting terminal(s) is/are provided in the bottom surface, the bottom surface recessed portion being to insert the mounting portion therein.

When it is thus configured, the conductor and the mounting terminal are formed integrally, so that the downward extension and mounting portion of the mounting terminal can be formed by bending the conductor. Further, the mounting portion is fitted into the bottom surface recessed portion provided on the bottom surface of the core. Therefore, the positioning of the conductor can be performed easily and surely by simply fitting the mounting portion in the bottom surface recessed portion. Furthermore, the mounting portion is fitted into the bottom surface recessed portion, so that the conductor can reduce its shake. Moreover, the positioning of the conductor is performed by fitting the mounting portion in the bottom surface recessed portion, so that the fluctuation in the characteristics of the magnetic elements can be reduced, facilitating the property designing. In addition, the thickness of the magnetic element can be reduced to the extent that the mounting portion is fitted in the bottom surface recessed portion, so that the height reduction and downsizing of the magnetic element are enabled.

Further, another invention is the magnetic element in which, in addition to the above, the number of piece(s) of end surface recessed portion(s) corresponding to the number of piece(s) of the mounting terminal(s) to fit the downward extension(s) of the mounting terminal(s) therein is/are provided on an end surface having an opening of the through hole of the core.

When it is thus configured, the downward extension is fitted in the end surface recessed portion provided on the end surface of the core in addition to the bottom surface recessed portion. Therefore, the positioning of the conductor can be performed more easily and surely. Further, by fitting the downward extension to the end surface recessed portion, the shaking of the conductor can be reduced. Furthermore, the positioning of the conductor is performed by fitting the downward extension in the end surface recessed portion, so that the fluctuation in the characteristics of the magnetic elements can be reduced, facilitating the property designing. In addition, the size in the longitudinal direction of the through hole of the magnetic element can be reduced to the extent that the downward extension is fitted in the end surface recessed portion, so that the downsizing of the magnetic element is enabled.

Furthermore, still another invention is the magnetic element in which, in addition to the above, the plurality of conductors are inserted through the through hole along a longitudinal direction of the through hole while the conductors are in the state of being distant from each other. When it is thus configured, the magnetic element can be used for various usage such as an inductor, noise filter, common choke coil, transformer, or the like used, for example, in a high-frequency-driven circuit, in accordance with the number of conductors thereof.

According to the present invention, it is possible to position a conductor easily in a magnetic element. Further, the magnetic element can reduce its outside dimension.

DETAILED DESCRIPTION OF THE PREFERRED EMBODIMENT

Figure 1:
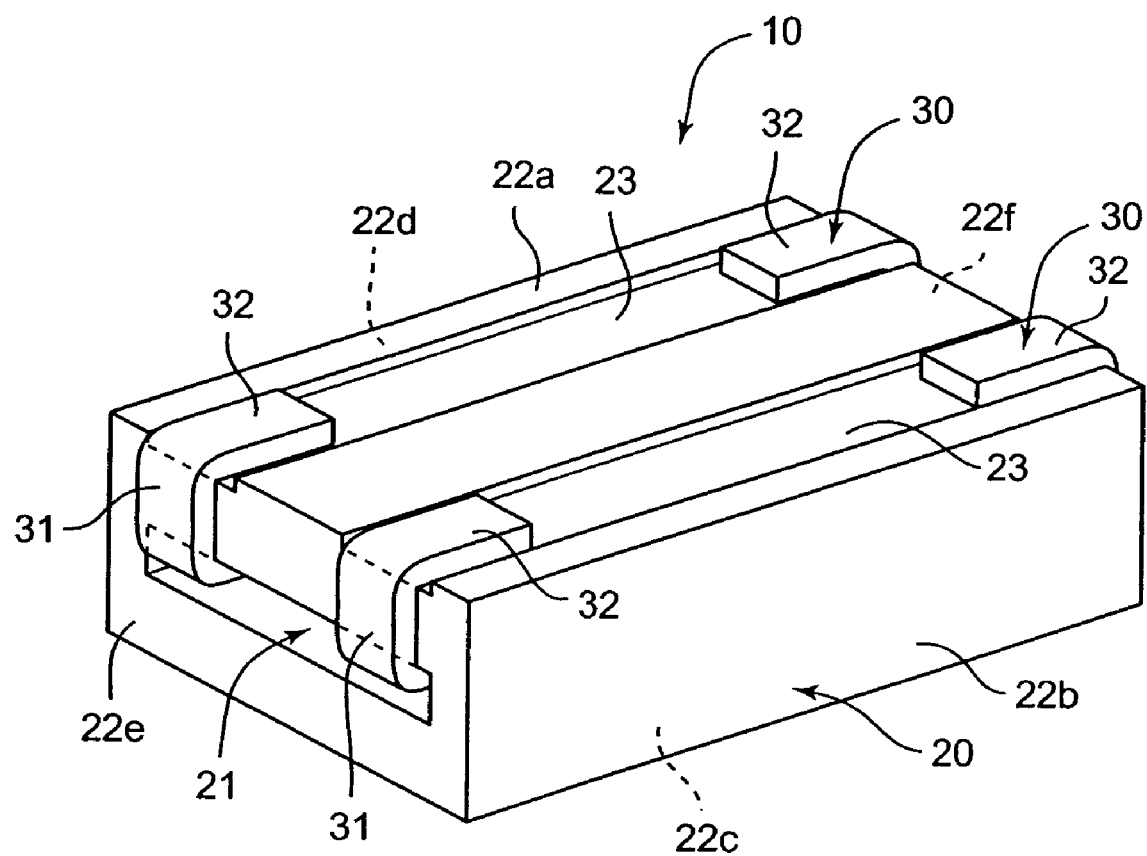
FIG. 1 is a perspective view showing an entire configuration of a magnetic element according to an embodiment of the present invention, the magnetic element being in the state with its bottom surface positioning upward.
Figure 2:
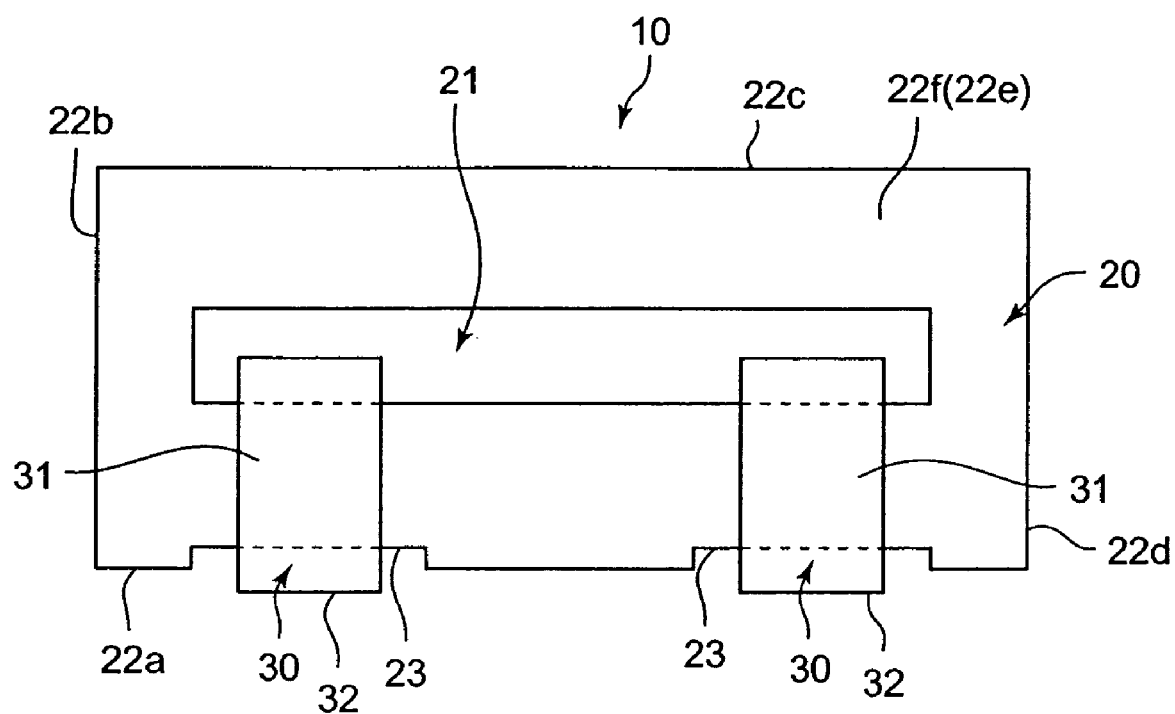
FIG. 2 is a front view showing the configuration of the magnetic element in FIG. 1.
Figure 3:
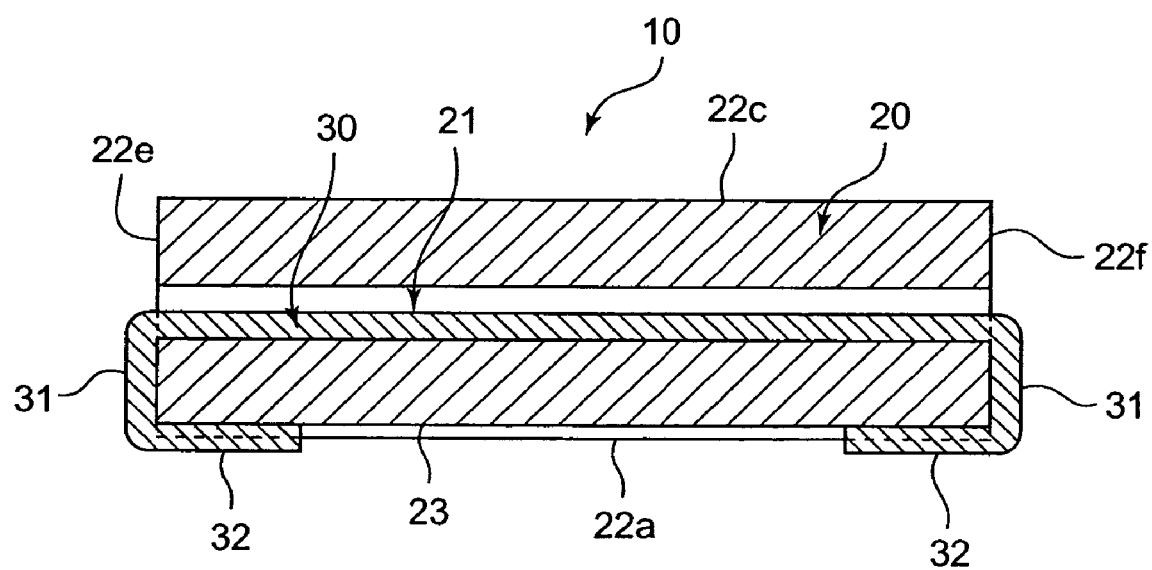
FIG. 3 is a sectional side view showing the configuration of the magnetic element in FIG. 1.

Hereinafter, a magnetic element 10 according to an embodiment of the present invention will be described based on FIGS. 1 to 3. FIG. 1 is a perspective view showing an entire configuration of the magnetic element 10 in which a bottom surface 22a is arranged to position upward. FIG. 2 is a front view showing the configuration of the magnetic element 10. Further, FIG. 3 is a sectional side view showing the configuration of the magnetic element 10.

Note that, in the description below, topside indicates an upper surface 22c side being distant from the later-described bottom surface 22a, and a bottom side indicates a side at which later-described bottom surface recessed portion 23 is provided. Further, a height direction indicates a vertical direction between the upper surface 22c and the bottom surface 22a in the magnetic element 10.

The magnetic element 10 according to the embodiment of the present invention includes a core 20 and conductors 30, as shown in FIG. 1 and so forth. Of these, the core 20 is made of Mn—Zn ferrite in view of a material. However, the material of the core 20 is not limited to the Mn—Zn ferrite, and various kinds of magnetic materials such as Ni—Zn ferrite, sendust (Fe—Si—Al: iron-silicon-alminium), permalloy (Fe—Ni), Fe—Si—Cr, or the like are also acceptable.

Further, the core 20 has almost a rectangular solid shape in appearance. Specifically, among six outer surfaces 22 composing the core 20 of the almost rectangular solid shape, such an outer surface that directly faces a mounting substrate (not shown) (the outer surface positioning upside in FIG. 1, the surface will be referred to as the bottom surface 22a in the description below) and the upper surface 22c in parallel therewith are designed to have the largest surfaces out of the six outer surfaces 22. Note that, in the description below, the six outer surfaces 22 include side surfaces 22b, 22d being in parallel with the longitudinal direction of a through hole 21 and end surfaces 22e, 22f respectively having an opening of the through hole 21, in addition to the bottom surface 22a and upper surface 22c. In the description referring to these plural outer surfaces 22, the bottom surface 22a, upper surface 22c, side surfaces 22b, 22d, and end surfaces 22e, 22f are also referred to as the outer surfaces 22a to 22f, respectively.

The core 20 is provided with the through hole 21. The through hole 21 is provided along in the longitudinal direction of the core 20 to pass through the core 20 in the longitudinal direction. Further, an inside wall surfaces (not shown) composing the through hole 21 are distant from the outer surfaces 22a to 22d by a predetermined size, respectively. Notwithstanding the above, in order to ensure the moldability of the through hole 21, the through hole 21 is designed to have a certain height or more. Incidentally, the height of the through hole 21 is set to 0.1 mm at minimum, as an example. Besides, the width of the through hole 21 is designed to be enough larger than the height.

Note that the core 20 finally has a tubular shape in appearance due to the through hole 21 thereof, and therefore, of the core 20, the thick wall portion except the through hole 21 corresponds to a tubular portion. The tubular shape does not mean that the cross-sectional geometric shape is of any particular shape. While shown as a rectangular tube in FIG. 1, the core can be any shape (circular, elliptical, etc.)

Further, in the core 20, the bottom surface recessed portions 23 are provided on the bottom surface 22a facing the mounting substrate. The bottom surface recessed portions 23 are recessed by a predetermined size toward the upper surface 22c side from the bottom surface 22a. Corresponding to the number of the conductors 30, two pieces of bottom surface recessed portions 23 are provided in the present embodiment. Here, inside the through hole 21, the conductors 30 are disposed along the longitudinal direction of the core 20. Accordingly, the bottom surface recessed portions 23 are also provided along the longitudinal direction of the core 20 even to go through the bottom surface 22a. Consequently, the two bottom surface recessed portions 23 have a groove shape, respectively, in appearance.

Besides, the bottom surface recessed portions 23 are provided at substantially symmetric positions by sandwiching a center line in the longitudinal direction of the bottom surface 22a of the core 20 therebetween. These two bottom surface recessed portions 23 are a certain size distant from each other. Therefore, it is configured that no short arises between the two conductors 30 even if they are fitted into the bottom surface recessed portions 23 by being bent.

Note that the depth of the bottom surface recessed portion 23 is designed to be smaller than the thickness of a later-described mounting portion 32. Therefore, when the mounting portions 32 are fitted into the bottom surface recessed portions 23, the mounting portions 32 are in a state of protruding from the bottom surface 22a.

Further, the conductor 30 is an elongate member of a flat (zonate) shape, as shown in FIG. 1, and is made of a metal such as copper when it comes to a material. Note that the material of the conductors 30 is not limited to copper and any material is acceptable as long as the material exhibits a low electric resistance and flexibility. The thicknesses of the conductors 30 are designed to be smaller than the height of the previously-described through hole 21, allowing to insert themselves easily into the through hole 21.

The surfaces of the conductors 30 are plated. The plating has a two-layered structure, in which a first layer (at a host material side such as of copper) in the plating process is composed of a material having favorable adhesiveness to the host material. As an example material exhibiting such favorable adhesiveness, there is a Ni-plated layer with respect to copper. Also, the second layer in the plating process is composed of a material to ensure wettability with respect to a solder when mounting. As an example material to ensure such wettability, there is a Sn-plated layer.

Further, as shown in FIGS. 1 to 3, of the conductor 30, a terminal portion (corresponding to a mounting terminal) protruding from the through hole 21 is bent downwardly along the end surfaces 22e, 22f of the core 20. In the description below, this portion (part of the mounting terminal) is defined as a downward extension 31. Further, the downward extension 31 extends to the bottom surface 22a, and after reaching to the bottom surface 22a, the downward extension 31 is bent along the bottom surface 22a this time. In this case, the lower end of the downward extension 31 is bent to fit into the bottom surface recessed portion 23. In the description below, of the downward extension 31 (conductor 30), a portion (part of the mounting terminal) to be fitted into the bottom surface recessed portion 23 is defined as a mounting portion 32. The mounting portion 32 is directed to a side leaving from the downward extension 31, and only a predetermined length thereof is fitted into the bottom surface recessed portion 23 along therewith.

Hereinafter, the description will be given of a manufacturing method to manufacture the magnetic element 10 of the above-described configuration. First, a molded body being a base of the core 20 is formed by Mn—Zn Ferrite, and then the molded body is sintered. At this time, for example, another bushing for molding is inserted into such a portion of the molded body that corresponds to the through hole 21. With the bushing, the through hole 21 is formed in the magnetic element 10 after the sintering. Note that the through hole 21 may be formed by a cutting work after the molded body is sintered. Further, the bottom surface recessed portions 23 are formed with respect to the molded body. The bottom surface recessed portion 23 is formed by cutting a predetermined depth the surface of the bottom surface 22a.

After the core 20 is formed, subsequently, the two pieces of conductors 30 having a predetermined length are inserted into the inside of the through hole 21. After the insertion, the portions of the conductors 30 protruding from the through hole 21 are bent at almost a right angle toward the bottom surface 22a. After this bending, the conductors 30 are bent at almost a right angle along the bottom surface 22a. In this bending, such portions of the conductors 30 that are to be bent are bent while positioning so that the portions are fitted into the bottom surface recessed portions 23. With these bendings, the downward extensions 31 and mounting portions 32 are formed. Note that an unnecessary portion of the mounting portions 32 may be cut before or after the bendings of the conductors 30. Further, such two bendings may be performed sequentially or concurrently using, for example, a pressing machine or the like. As described above, the magnetic element 10 is completed. Note that the bottom surface recessed portions 23 may be formed before or after the sintering step of the core 20.

According to the magnetic element 10 of the above-described configuration, the bottom surface recessed portions 23 are provided on the bottom surface 22a, and the mounting portions 32 formed by bending the conductors 30 are fitted into the bottom surface recessed portions 23. Hence, the conductors 30 are positioned simply by fitting the mounting portions 32 into the bottom surface recessed portions 23. In other words, with the provision of the bottom surface recessed portions 23, the conductors 30 can be positioned easily and surely. Backed by this, it is possible to prevent a short between the two conductors 30, and therefore, the problem that the magnetic element 10 is damaged by the short can be prevented.

Further, the mounting portions 32 are fitted into the bottom surface recessed portions 23, so that shakings of the conductors 30 can be reduced. Furthermore, since the mounting portions 32 are fitted into the bottom surface recessed portions 23, the conductors 30 are positioned, so that the fluctuation in the properties of the magnetic element 10 can be reduced and the properties/quality of the magnetic element 10 can be stabilized.

Moreover, since the mounting portions 32 are fitted into the bottom surface recessed portions 23, the height of the magnetic element 10 can be reduced to the extent of the fitted length. With this, the size in the height direction of the magnetic element 10 can be reduced, allowing the magnetic element 10 to be downsized.

The description has been given of the one example configuration of the magnetic element 10 according to the embodiment of the present invention. However, the magnetic element according to the present invention is not limited to the above-described magnetic element 10 and a variety of modifications can be made thereto. Modification examples are shown in FIGS. 4 to 11.

Figure 4:
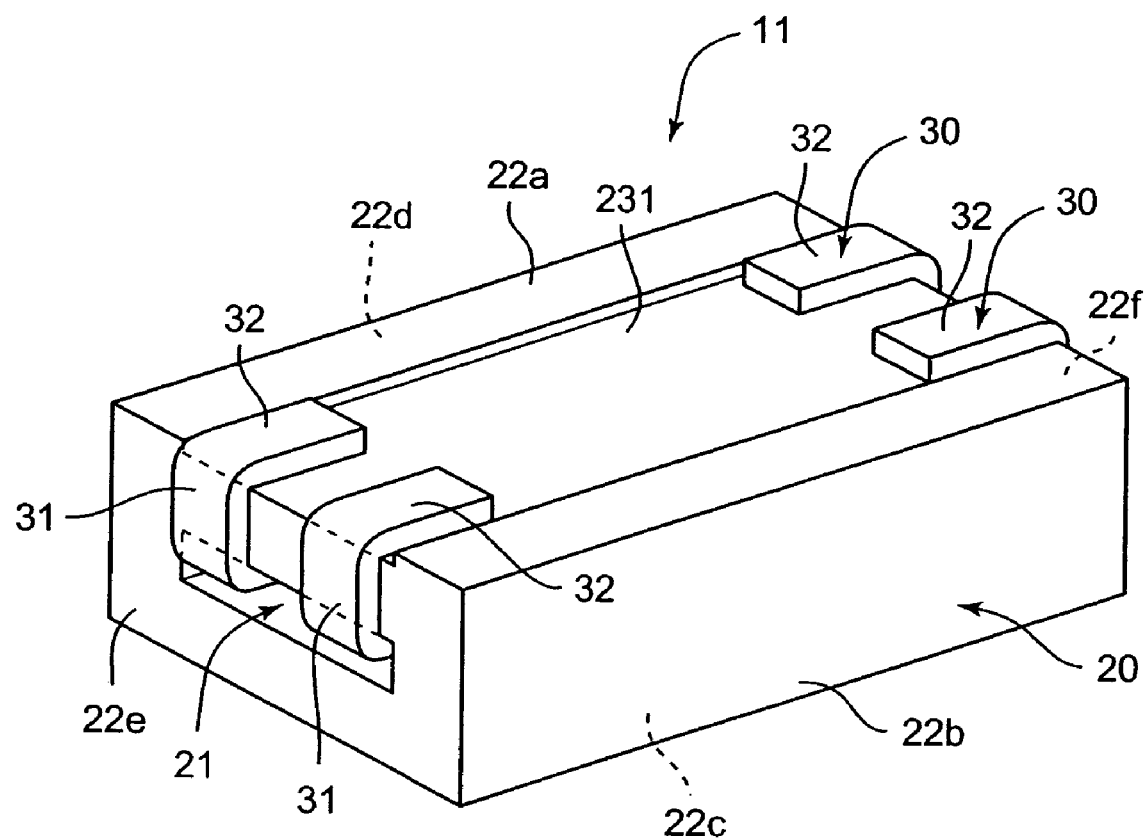
FIG. 4 is a perspective view related to a modification example of the magnetic element in FIG. 1 and showing a configuration of a magnetic element having a wider bottom surface recessed portion and in the state of being disposed with its bottom surface positioning upward.

A magnetic element 11 shown in FIG. 4 has a bottom surface recessed portion of a shape differently from that of the magnetic element 10 shown in FIG. 1. Specifically, the bottom surface recessed portion 231 of the magnetic element 11 shown in FIG. 4 is not provided for each conductor 30. In other words, in the magnetic element 11, plural (two in the present embodiment) conductors 30 are disposed in the same bottom surface recessed portion 231.

In this case, for positioning the conductors 30, the respective conductors 30 are disposed along the respective edge portions of the bottom surface recessed portion 231. By doing this, the respective conductors 30 can be positioned. Also, in the magnetic element 11, the conductors 30 position in the bottom surface recessed portion 231, so that the height of the magnetic element 11 can be reduced, allowing the magnetic element 11 to be downsized.

Figure 5:
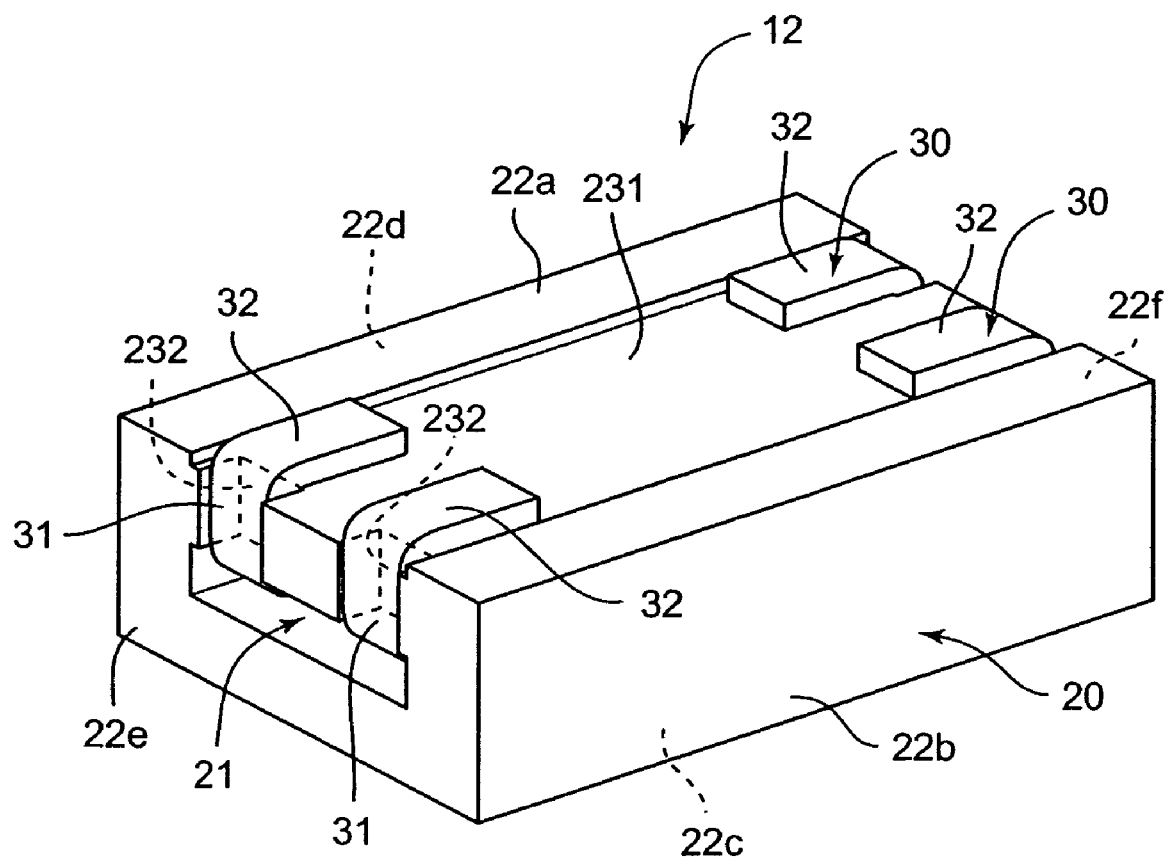
FIG. 5 is a perspective view related to a modification example of the magnetic element in FIG. 1 and showing a configuration of a magnetic element having the wider bottom surface recessed portion together with end surface recessed portions and in the state of being disposed with its bottom surface positioning upward.

Further, a magnetic element 12 shown in FIG. 5 has a bottom surface recessed portion 231 similar to that of the magnetic element 11 shown in FIG. 4. However, the magnetic element 12 has end surface recessed portions 232 on the end surfaces 22e, 22f in addition to the bottom surface recessed portion 231. The end surface recessed portions 232 are formed to retire by a predetermined length from the end surfaces 22e, 22f and provided to cross the end surfaces 22e, 22f from the bottom surface 22a to the through hole 21.

The downward extensions 31 are fitted into such end surface recessed portions 232. Backed by this, the downward extensions 31 are prevented from protruding in the longitudinal direction of the magnetic element 12, so that the longitudinal size of the magnetic element 12 can be reduced. In other words, the magnetic element 12 can be downsized further. Moreover, the downward extensions 31 are fitted into the end surface recessed portions 232, so that the positioning of the conductors 30 can be performed more surely.

Here, in the magnetic element 12 shown in FIG. 5, the depth of the end surface recessed portion 232 is designed to be larger than the thickness of the downward extension 31 (conductor 30). Backed by this, the downward extensions 31 are in the state of being recessed from the end surfaces 22e, 22f instead of protruding therefrom. Therefore, the longitudinal size of the magnetic element 12 can be reduced, so that the magnetic element 12 can be downsized.

Figure 10:
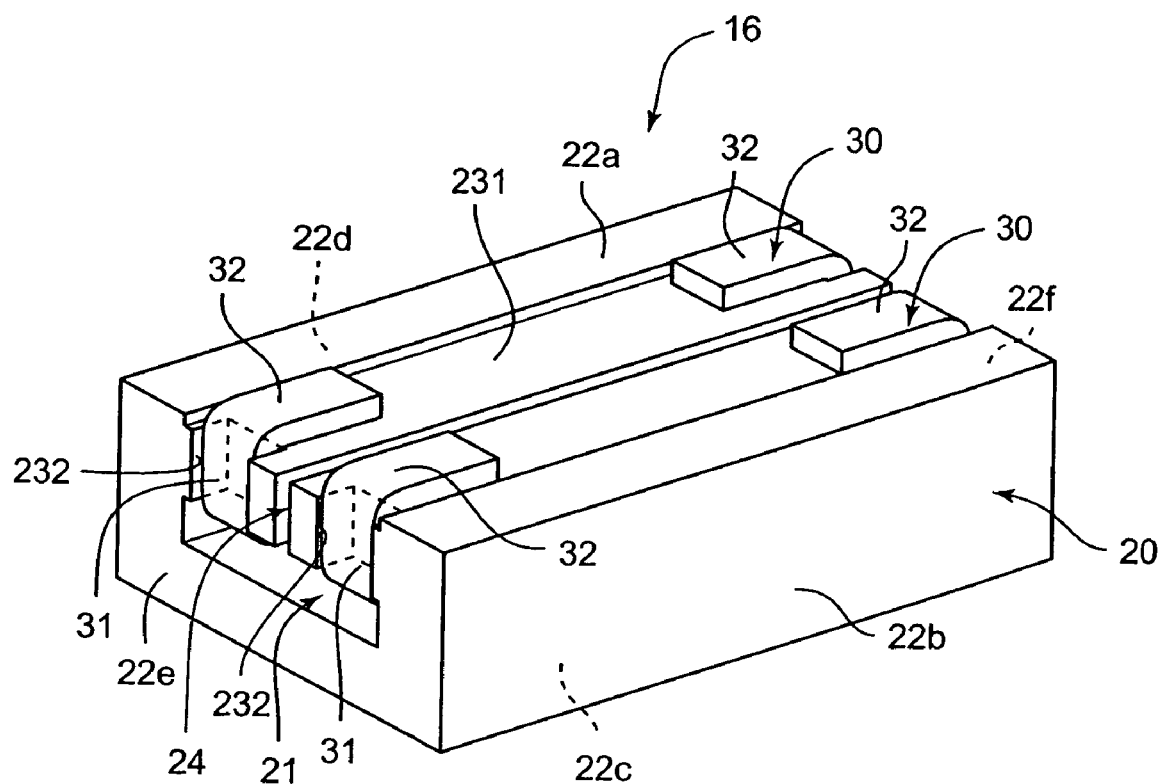
FIG. 10 is a perspective view related to a modification example of the magnetic element in FIG. 1 and showing a configuration of a magnetic element having a slit formed in the core of the magnetic element in FIG. 5 and in the state of being disposed with its bottom surface positioning upward.
Figure 11:
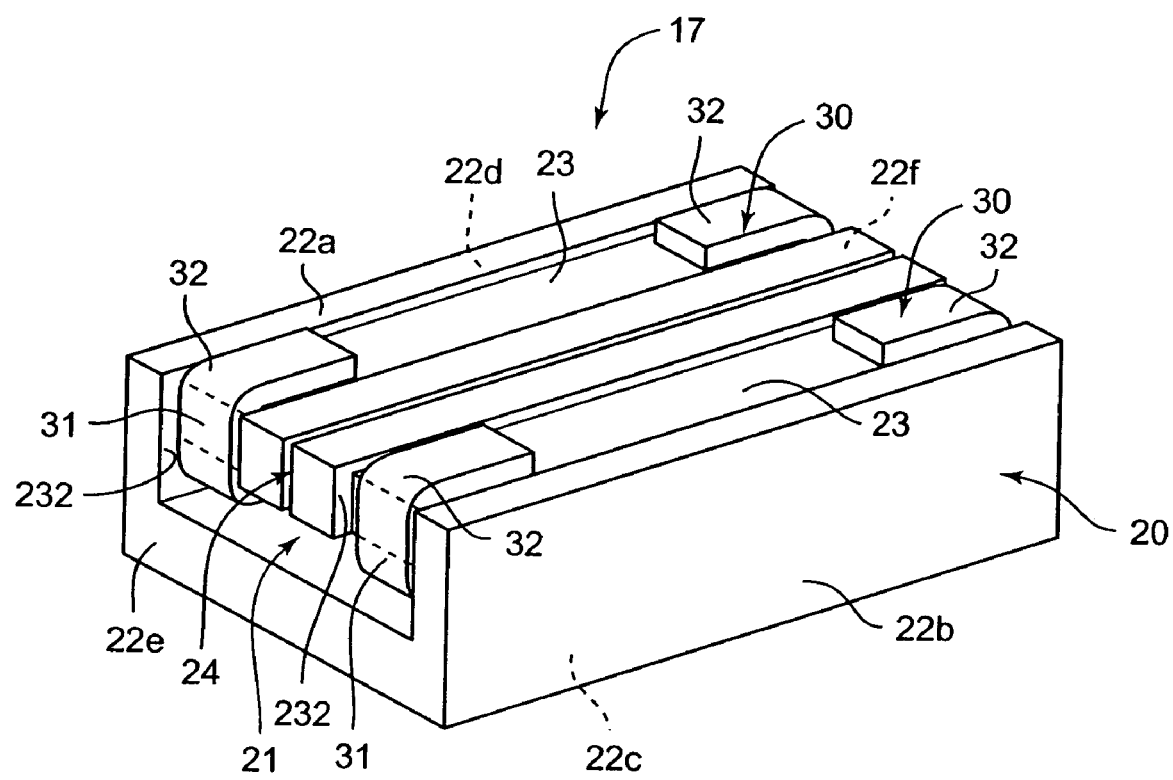
FIG. 11 is a perspective view related to a modification example of the magnetic element in FIG. 1 and showing a configuration of a magnetic element having a slit formed in the core of the magnetic element in FIG. 6 and in the state of being disposed with its bottom surface positioning upward.

Note that, in FIG. 5 and later-described FIGS. 6, 10, 11, the bottom surface recessed portions 23, 231 are provided together with the end surface recessed portions 232. However, in the configurations of these drawings, it is possible to adopt a configuration in which only the end surface recessed portions 232 are provided without providing the bottom surface recessed portions 23, 231.

Figure 6:
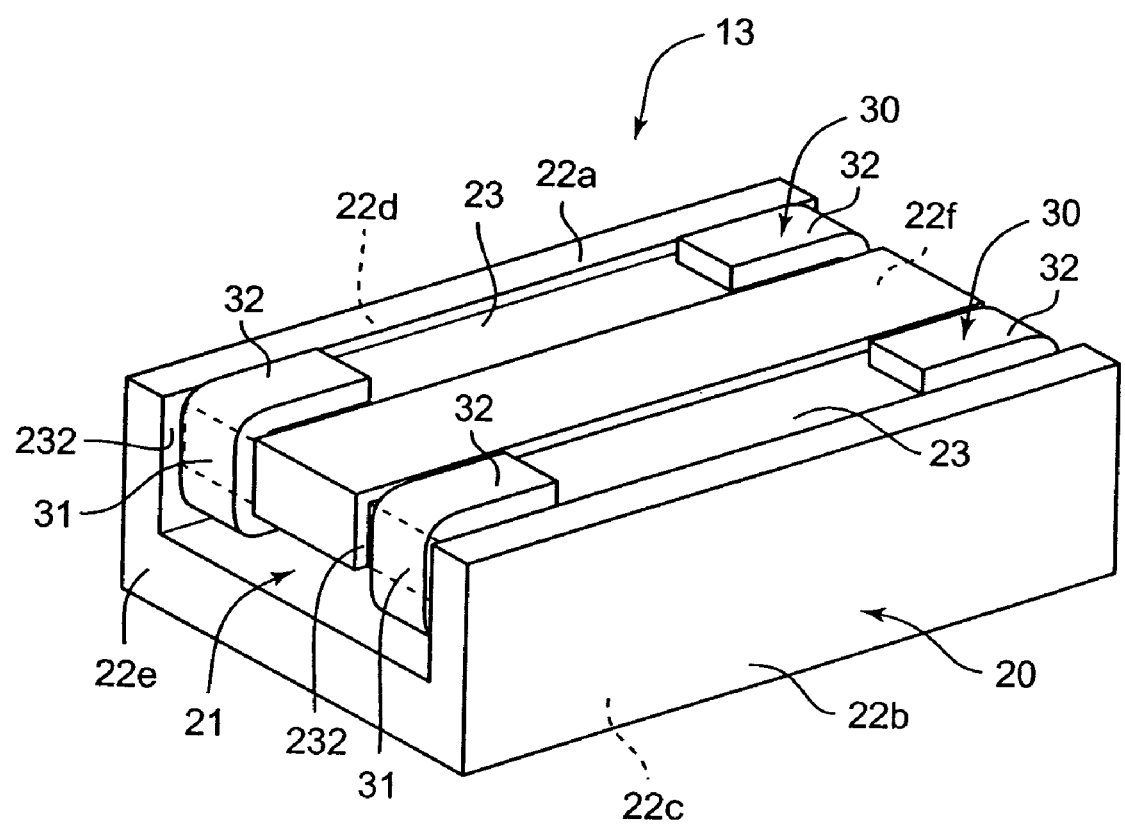
FIG. 6 is a perspective view related to a modification example of the magnetic element in FIG. 1 and showing a configuration of a magnetic element having two narrow bottom surface recessed portions together with the end surface recessed portions and in the state of being disposed with its bottom surface positioning upward.

Further, a magnetic element 13 shown in FIG. 6 has the same two bottom surface recessed portions 23 as shown in FIG. 1 and the same two end surface recessed portions 232 as shown in FIG. 5. Combination of these allows further downsizing of the magnetic element 13. Moreover, the downward extensions 31 are fitted into the end surface recessed portions 232, so that the positioning of the conductors 30 can be performed more surely.

Further, a magnetic element 14, a magnetic element 15, a magnetic element 16 and a magnetic element 17 shown in FIGS. 7 to 11, respectively, are configured to have a slit 24 in addition to the configurations of the magnetic element 10, magnetic element 11, magnetic element 12 and magnetic element 13 shown in the above-described FIGS. 1 to 6, respectively. The slit 24 serves as a magnetic gap and is provided to go from the bottom surface 22a through the through hole 21 and to cross over the bottom surface 22a along the longitudinal center of the bottom surface 22a. In other words, the bottom surface 22a is designed to be divided into two by the slit 24 and the two bottom surfaces 22a are in the state of not contacting to each other.

In the thus-configured magnetic element 14, magnetic element 15, magnetic element 16 and magnetic element 17, an improvement in an inductance value (=no decrease) in direct current superposition can be secured in addition to the above-described merits of positioning, height reduction, and so forth. In addition, the slit 24 is provided on the bottom surface 22a. Therefore, for example, in a circuit to which the magnetic element 14, magnetic element 15, magnetic element 16 or magnetic element 17 is mounted, an influence of magnetic flux leakage to the other electronic parts from the above of the respective magnetic elements can be reduced as compared to the case where the slit is provided, for example, on the upper surface 22c.

Figure 7:
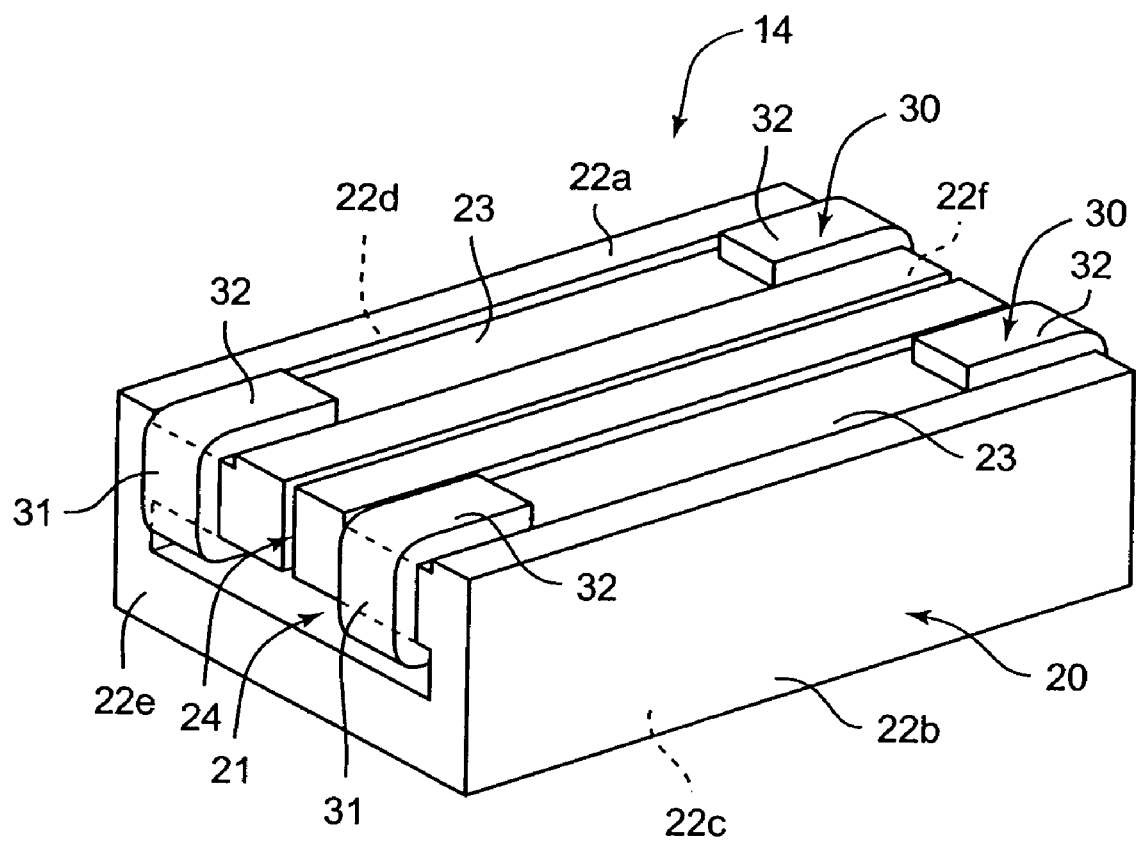
FIG. 7 is a perspective view related to a modification example of the magnetic element in FIG. 1 and showing a configuration of a magnetic element having a slit formed in the core and in the state of being disposed with its bottom surface positioning upward.
Figure 8:
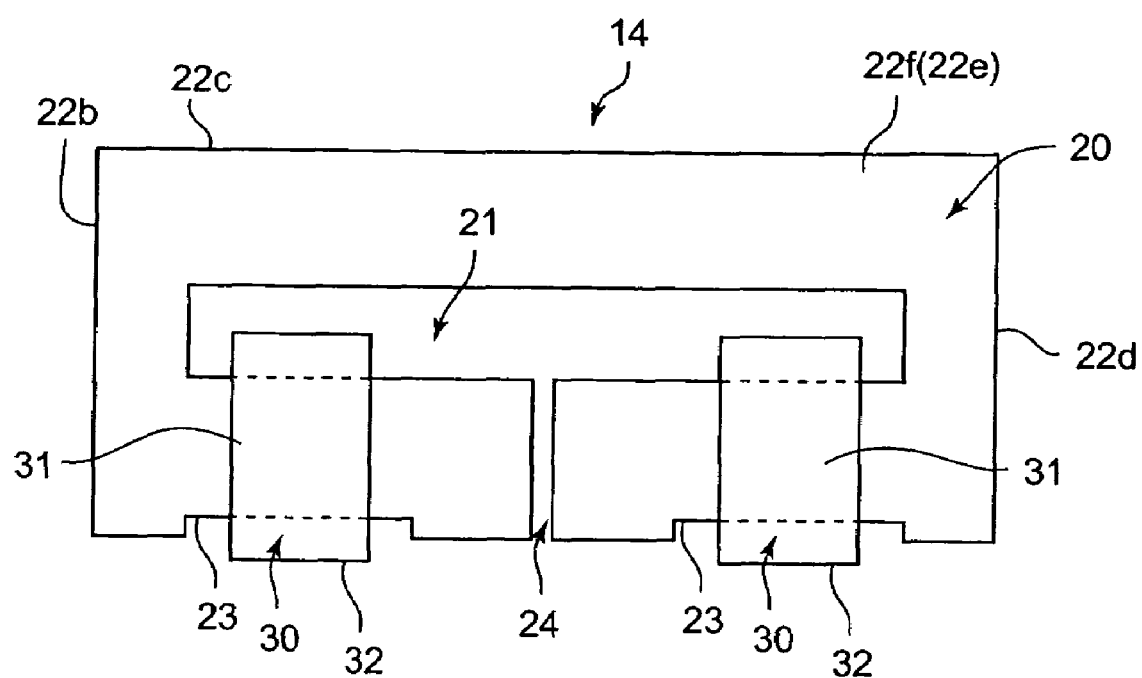
FIG. 8 is a front view showing the configuration of the magnetic element in FIG. 7.
Figure 9:
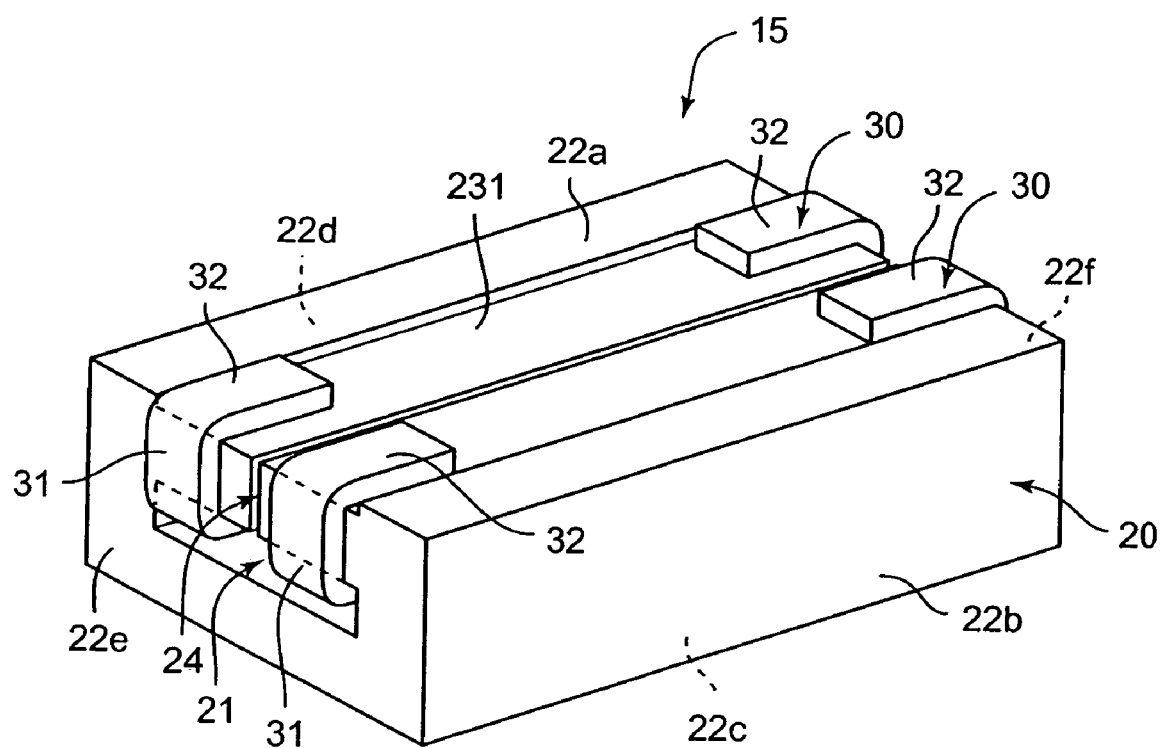
FIG. 9 is a perspective view related to a modification example of the magnetic element in FIG. 1 and showing a configuration of a magnetic element having a slit formed in the core of the magnetic element in FIG. 4 and in the state of being disposed with its bottom surface positioning upward.

Here, the magnetic element 14 shown in FIGS. 7 and 8 is the one having the slit 24 formed on the magnetic element 10 shown in FIGS. 1 to 3. Also, the magnetic element 15 shown in FIG. 9 is the one having the slit 24 formed on the magnetic element 11 shown in FIG. 4. Besides, the magnetic element 16 shown in FIG. 10 is the one having the slit 24 formed on the magnetic element 12 shown in FIG. 5. Further, the magnetic element 17 shown in FIG. 11 is the one having the slit 24 formed on the magnetic element 13 shown in FIG. 6.

Note that FIG. 7 and FIGS. 9 to 11 are perspective views showing the configurations of the magnetic elements 14 to 17, respectively. Further, FIG. 8 shows the shape of the slit 24 and is a front view showing the configuration of the magnetic element 14.

Further, in the above-described embodiment, the magnetic element 10 is provided with the two conductors 30 and the two bottom surface recessed portions 23 together. However, the number of the conductors 30 or bottom surface recessed portions 23 is not limited to two, and one or three or more is also accepted.

Furthermore, in the above-described embodiment, the depth of the bottom surface recessed portion 23 is designed to be smaller than the thickness of the mounting portion 32. However, the depth of the bottom surface recessed portion 23 may be designed to be the same size as of the thickness of the mounting portion 32 or larger. Also, when the magnetic element 10 is thus configured, the magnetic element 10 can be mounted onto a mounting substrate favorably, provided that, for example, a mounting portion of the mounting substrate protrudes or another conductive member is provided therebetween.

Further, in the magnetic element 12 shown in FIG. 5 described above, the depth of the end surface recessed portion 232 is designed to be larger than the thickness of the downward extension 31 (conductor 30). However, the depth of the end surface recessed portion 232 may be the same size as the thickness of the downward extension 31 (conductor 30) or smaller. Also, when the magnetic element 12 is thus configured, the longitudinal size of the magnetic element 12 can be reduced in that the downward extensions 31 (conductors 30) are fitted into the end surface recessed portions 232.

Furthermore, the usage of the magnetic element according to the present invention has no limitation. For instance, when the magnetic element has only a single conductor, the magnetic element can be used as an inductor, a noise filter or the like used in a high-frequency-driven circuit. Also, when the magnetic element has two or more conductors, the magnetic element can be used as a multiple inductor, a multiple noise filter, a common-mode choke coil, transformer or the like used in the high-frequency-driven circuit.

Note that when the magnetic element is used as the multiple inductor, multiple noise filter, common-mode choke coil, transformer or the like used in the high-frequency-driven circuit, it is desirable to provide a slit passing through the core.

Also, in the above-described embodiment, the core 20 has almost a rectangular solid shape in appearance. However, the shape of the core is not limited to the almost rectangular solid shape, and various shape such as an almost tubular shape is applicable. Also, the conductor 30 in the above-described embodiment forms the downward extension 31 and the mounting portion 32 by bending itself. In other words, the conductor 30 is provided integrally with the mounting terminal composed of the downward extension 31 and mounting portion 32. However, the configuration of the mounting terminal is not limited thereto, and a configuration in which a mounting terminal is provided independently from the conductor 30 may be accepted.

Note that when adopting the independent configuration, for example, in the state where the conductor 30 is inserted into the through hole 21, one end side of the independently-provided mounting terminal processed in advance to have a C shape is inserted into the through hole 21 in a manner overlapping the conductor 30. In this case, a conductive adhesive agent or the like may be coated on one end side of the mounting terminal in advance. If so, the bending process becomes unnecessary after the conductor 30 is inserted into the through hole 21, so that productivity can be improved as well.

Further, in the above-described embodiment, the bottom surface recessed portion 23 has a groove shape passing through the bottom surface 22a. However, the shape of the bottom surface recessed portion is not limited to the groove shape passing through the bottom surface 22a. For instance, the bottom surface recessed portions may be designed to recess from the end surfaces 22e, 22f by a predetermined length along the bottom surface 22a.

The magnetic element according to the present invention can be used in the field of electric equipment.

What is claimed is:

1. A magnetic element comprising:
   a core formed by sintering a ferrite material have a tubular shape and including a tubular portion and a through hole passing through the tubular portion;
   a conductor having a linear shape, electrical conductivity and a plating performed onto a surface thereof, said conductor being to be inserted through the through hole; and
   a mounting terminal with one end side of said mounting terminal being electrically connected to said conductor and another side of said mounting terminal positioning at a bottom surface of said core, said mounting terminal being to be mounted on an external mounting substrate facing the bottom surface,
   wherein said conductor is formed integrally with said mounting terminal and said mounting terminal includes a downward extension extending from the one end side of said conductor to the bottom surface side of said core formed by bending and a mounting portion positioning on the bottom surface of said core formed by bending, and
   wherein a number of piece(s) of bottom surface recessed portion(s) corresponding to a number of piece(s) of said mounting terminal(s) is/are provided in the bottom surface, the bottom surface recessed portion being to insert the mounting portion therein.

2. The magnetic element according to claim 1:
   wherein a number of piece(s) of end surface recessed portion(s) corresponding to a number of piece(s) of said mounting terminal(s) to fit the downward extension(s) of said mounting terminal(s) therein is/are provided on an end surface having an opening of the through hole of said core.

3. The magnetic element according to claim 1:
   wherein a plurality of said conductors are inserted through the through hole along a longitudinal direction of the through hole while said conductors are in the state of being distant from each other.

4. The magnetic element according to claim 2:
   wherein a plurality of said conductors are inserted through the through hole along a longitudinal direction of the through hole while said conductors are in the state of being distant from each other.

* * * * *